(12) United States Patent
Hsieh et al.

(10) Patent No.: US 7,535,771 B2
(45) Date of Patent: May 19, 2009

(54) DEVICES AND METHODS TO IMPROVE ERASE UNIFORMITY AND TO SCREEN FOR MARGINAL CELLS FOR NROM MEMORIES

(75) Inventors: Wen-Yi Hsieh, Yingsi Village (TW); Ching-Chung Lin, Banciao (TW); Ken-Hui Chen, Dali (TW); Chun-Hsiung Hung, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 0 days.

(21) Appl. No.: 11/096,878

(22) Filed: Apr. 1, 2005

(65) Prior Publication Data
US 2006/0092709 A1 May 4, 2006

Related U.S. Application Data

(60) Provisional application No. 60/624,553, filed on Nov. 4, 2004.

(51) Int. Cl.
*G11C 16/04* (2006.01)

(52) U.S. Cl. .............................. 365/185.29; 365/185.3; 365/218

(58) Field of Classification Search ............ 365/185.29, 365/185.3, 218
See application file for complete search history.

(56) References Cited

U.S. PATENT DOCUMENTS

| 5,724,289 | A  | * | 3/1998  | Watanabe ................. 365/201 |
| 6,222,779 | B1 | * | 4/2001  | Saito et al. ............. 365/189.09 |
| 6,545,911 | B2 |   | 4/2003  | Chou et al. |
| 6,577,540 | B2 |   | 6/2003  | Choi |
| 6,834,012 | B1 | * | 12/2004 | He et al. ................. 365/185.18 |
| 6,967,873 | B2 | * | 11/2005 | Hamilton et al. ......... 365/185.3 |
| 7,073,103 | B2 | * | 7/2006  | Gongwer et al. ............ 714/718 |
| 2006/0018163 | A1 | * | 1/2006 | Kwon et al. ........... 365/185.29 |

* cited by examiner

*Primary Examiner*—Huan Hoang
*Assistant Examiner*—Anthan T Tran
(74) *Attorney, Agent, or Firm*—Jianq Chyun IP Office

(57) ABSTRACT

A NROM memory device includes an array of memory cells and first and second bit lines. The first and second bit lines are coupled to opposite sides of the memory cells. During an erase operation, one of the sides of the memory cells receives a positive voltage and the other side couples to a common node or a limited current source. Methods are also disclosed that can easily screen for marginal memory cells based on a threshold voltage distribution of the memory cells.

7 Claims, 7 Drawing Sheets

DEVICES AND METHODS TO IMPROVE ERASE UNIFORMITY AND TO SCREEN FOR MARGINAL CELLS FOR NROM MEMORIES

RELATED APPLICATION

This application claims the benefit of U.S. Provisional Application No. 60/624,553, entitled "NROM MEMORY DEVICES AND METHODS TO IMPROVE ERASE UNIFORMITY AND TO SCREEN FOR MARGINAL MEMORY CELLS," filed on Nov. 4, 2004, which is hereby incorporated herein by reference.

FIELD

The present invention relates generally to non-volatile memories and, more particularly, to devices and methods to improve erase uniformity and to screen for marginal memory cells for nitride read-only memories (NROMs).

BACKGROUND

The increasing demand for consumer electronics, such as digital cameras, MP3 players, laptop computers, and personal data assistants (PDAs), requires non-volatile memory devices to store large amounts of data. Non-volatile memory devices for mass storage are cost driven in order to obtain the lowest cost productions. One type of low cost non-volatile memory is a nitride read only memory (NROM).

A NROM memory cell includes an oxide-nitride-oxide (ONO) gate dielectric and a controlling gate above the ONO gate dielectric. It allows two spatially-separated charge distributions in the nitride layer of the ONO gate dielectric, respectively, at the areas above the source and drain junctions of the memory cell. As a result, the ONO dielectric can store two bits of information per memory cell above those junctions. Thus, the NROM 2-bit memory cell architecture is attractive at least because it can decrease memory array size and the cost of making non-volatile memory devices.

An NROM memory cell can be programmed by "channel hot-electron injection." In a program operation, depending on the voltages applied to source, drain, and gate nodes, the electrons in the drain's pinch-off region can move toward the nitride layer of the ONO dielectric to program the memory cell. The NROM memory cell can be erased by "band-to-band hot hole injection." In an erase operation, depending on the voltages applied, holes are generated by band-to-band tunneling under the ONO dielectric of the appropriate junction. The holes can be injected into the ONO dielectric if a strong lateral electric field is generated in the channel region. Those injected holes can combine with electrons of the stored charge to erase the memory cell for a particular bit above a desired junction.

Erase operations rely heavily on having a strong lateral electric field generated in the channel region. To perform an erase operation correctly, proper voltages must be applied to the source, drain, and gate nodes of the memory cell. FIGS. 1 and 2 illustrate prior art NROM cells with the applied node voltages shown to perform prior erase operations. Referring to FIG. 1, a single side erase can be performed using band-to-band hot hole injection for the NROM memory cell. For example, to erase Bit 1, node 101 receives a (−) negative voltage from a negative pump circuit, node 102 receives a (+) positive voltage from a positive pump circuit, and node 103 is connected to ground. To erase Bit 2, node 101 receives a (−) negative voltage from a negative pump circuit, node 102 is connected to ground, and node 103 receives a (+) positive voltage from a positive pump circuit. The following TABLE 1 lists the voltages and connections for the nodes of FIG. 1, as detailed above.

TABLE 1

| | (Prior Erase Operation) | |
|---|---|---|
| Nodes | Erasing Bit 1 | Erasing Bit 2 |
| Node 101 | (−) Negative Voltage | (−) Negative Voltage |
| Node 102 | (+) Positive Voltage | GND |
| Node 103 | GND | (+) Positive Voltage |

This prior NROM memory cell operation suffers from a disadvantage that if the (+) positive voltage applied to nodes 102 or 103 to erase Bit 1 or Bit 2, respectively, exceeds the punch-through voltage of the memory cell, the positive pump circuit will crash, causing the erase operation to fail. This occurs when the bit-line bias is over the punch-through voltage. For example, when a large bias exists between the source and the drain, punch through may occur at the channel region, causing the voltage difference to drop. The drop in the voltage difference may result in an insufficient lateral electric field, thereby impacting an erase operation or causing non-erase of the bit.

Referring to FIG. 2, to erase Bit 1, node 201 receives a (−) negative voltage from a negative pump circuit, node 202 receives a (+) positive voltage from a positive pump circuit, and node 103 is floating. To erase Bit 2, node 201 receives a (−) negative voltage from a negative pump circuit, node 202 is floating, and node 203 receives a (+) positive voltage from a positive pump circuit. The following TABLE 2 lists the voltages and connections for the nodes of FIG. 2, as detailed above.

TABLE 2

| | (Prior Erase Operation) | |
|---|---|---|
| Nodes | Erasing Bit 1 | Erasing Bit 2 |
| Node 201 | (−) Negative Voltage | (−) Negative Voltage |
| Node 202 | (+) Positive Voltage | Floating |
| Node 203 | Floating | (+) Positive Voltage |

This prior NROM memory cell suffers from a disadvantage that nodes 202 or 203, when floating to erase Bits 1 or 2, may be coupled to an uncertain voltage level due to bit-line coupling or leakage current, causing the erase operation to fail. In particular, the uncertainty in voltage level may cause erase non-uniformity across memory cells.

Furthermore, some memory cells in the prior art NORM memory arrays may suffer marginal defects, such as buried drain oxide breakdown, source-drain leakage, and so forth. Such marginal defects can cause serious problems in an NROM memory array after fabrication, and screening such defects during testing can be difficult. As noted above, if one side of a memory cell is connected to GND and the other side of the memory cell is connected to a positive pump circuit, the bit-line bias may exceed the punch-through voltage, causing the pump circuit to crash. Moreover, if one side of the memory cell is floating during an erase, the memory cell can be coupled to an uncertain voltage that causes instabilities during erase operations. For example, the threshold voltage (Vt) distribution after an erase operation will become wider. The variation of the uncertain voltage level may cause erase non-uniformity across the memory cells.

Thus, what is needed are improved NROM non-volatile memory devices and NROM memory cell operations and testing methods to screen for marginal defects.

SUMMARY

According to one aspect of the invention, an NROM memory array includes a plurality of memory cells and first and second bit lines. The first and second bit lines are coupled to opposite sides of the memory cells. During an erase operation, one of the sides of the memory cells receives a positive voltage and the other side couples to a common node or a limited current source.

According to another aspect of the invention, a method for determining marginal memory cells in an NROM memory array includes pre-programming bits of the memory cells in the memory array to a pre-defined value. The memory cells in the memory array are erased. The memory cells in the memory array are screened for marginal memory cells based on a threshold voltage distribution of the memory cells during the erase.

According to another aspect of the invention, an NROM memory cell includes first, second, and third nodes. The first node receives a negative voltage. The second node receives a positive voltage or couples to a common node. The third node receives a positive voltage or couples to a common node, wherein when the second node receives the positive voltage, the third node couples to a common node coupled to a third node of at least one other NROM memory cell.

According to another aspect of the invention, an NROM memory cell includes first, second, and third nodes. The first node receives a negative voltage. The second node receives a positive voltage or couples to a limited current source. The third node receives a positive voltage or couples to a limited current source, and wherein when the second node receives the positive voltage, the third node couples to a limited current source coupled to a third node of at least one other NROM memory cell.

According to another aspect of the invention, an NROM memory array includes a plurality of memory cells, a negative pump circuit, a positive pump circuit, and a common node or a limited current source. Each memory cell has first, second, and third nodes. The negative pump circuit supplies negative voltage to the first node of the memory cells. The positive pump circuit supplies positive voltage to the second or third node of the memory cells. The common node or limited current source is coupled to the second or third nodes, wherein one of the second and third nodes is coupled to the common node or limited current source, and the other node is coupled to the positive pump circuit.

According to another aspect of the invention, a method is disclosed for screening memory cells. A memory array including a plurality of memory cell blocks is preprogrammed. The memory array is erased. Each memory cell block of the memory array is verified. Marginal cell blocks are identified based on a threshold voltage distribution.

According to another aspect of the invention, a method is disclosed for testing a memory array. Each memory cell in the memory array is preprogrammed to a 0 logic level. The memory array is erased with a hole injection process. Erase-stubborn memory cells are screened in the memory array based on a threshold voltage distribution of blocks of memory cells in the memory array.

DRAWINGS

The accompanying drawings, which are incorporated in, and constitute a part of the specification, illustrate exemplary implementations and examples of the invention and, together with the detailed description, serve to explain the principles of the invention. In the drawings, FIG. 1 illustrates a prior art NROM memory cell during an erase operation;

DETAILED DESCRIPTION

Reference will now be made in detail to exemplary embodiments and examples of the invention, some of which are illustrated in the accompanying drawings. Wherever possible, the same reference numbers will be used throughout the drawings to refer to the same or like parts.

The following examples and implementations can overcome disadvantages of conventional NROM memory devices and improve erase uniformity for NROM memory cells and screening of memory cells for marginal defects. According to one example, an NROM memory device includes an array of memory cells and first and second bit lines. The first and second bit lines are coupled to opposite sides of the memory cells. During an erase operation, one side of the memory cells receives a positive voltage and the other side couples to a common node or a limited current source. By coupling to a common node or a limited current source, the source-side voltage can be stabilized and identical for each NROM cell in a memory array during an erase, thereby improving erase uniformity.

Other examples and implementations can avoid punch through and maintain a desired lateral electric field during an erase operation, which also improves erase uniformity. Additionally, as described below, a memory array can be easily screened for marginal memory cells based on a threshold voltage distribution of the memory cells after a unique test mode erasing operation.

Figure 1:
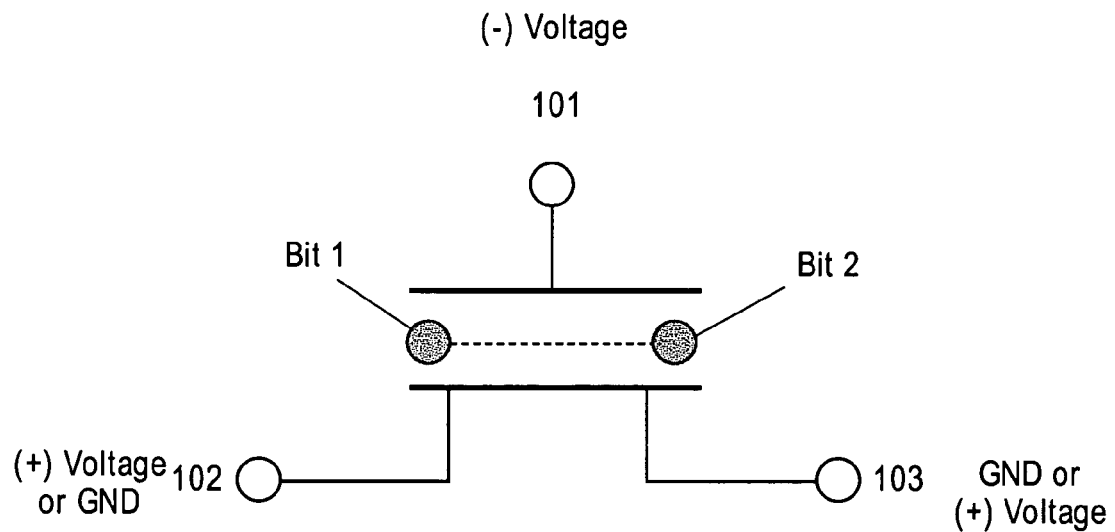
Figure 2:
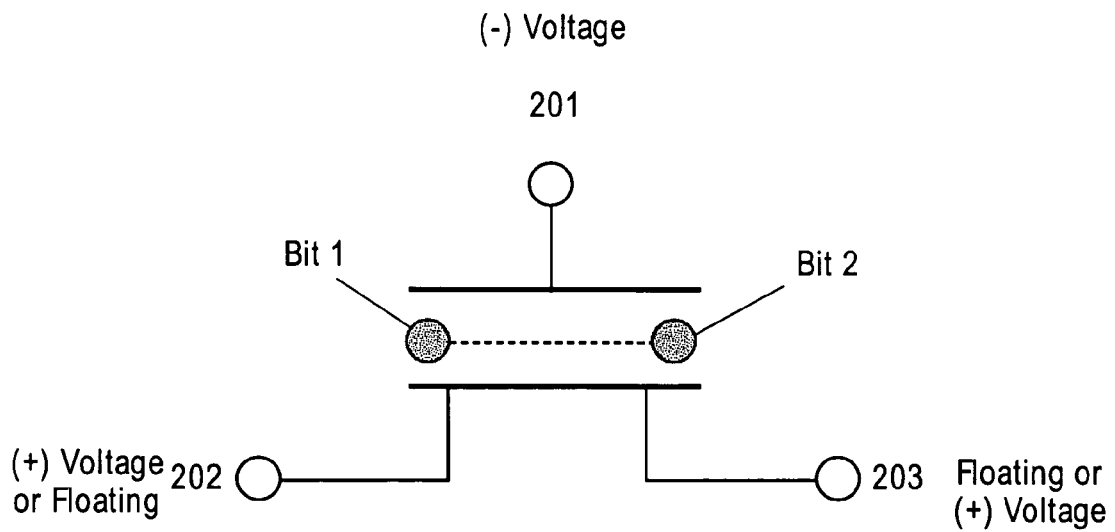
FIG. 2 illustrates another prior art NROM memory cell during an erase operation.
Figure 3:
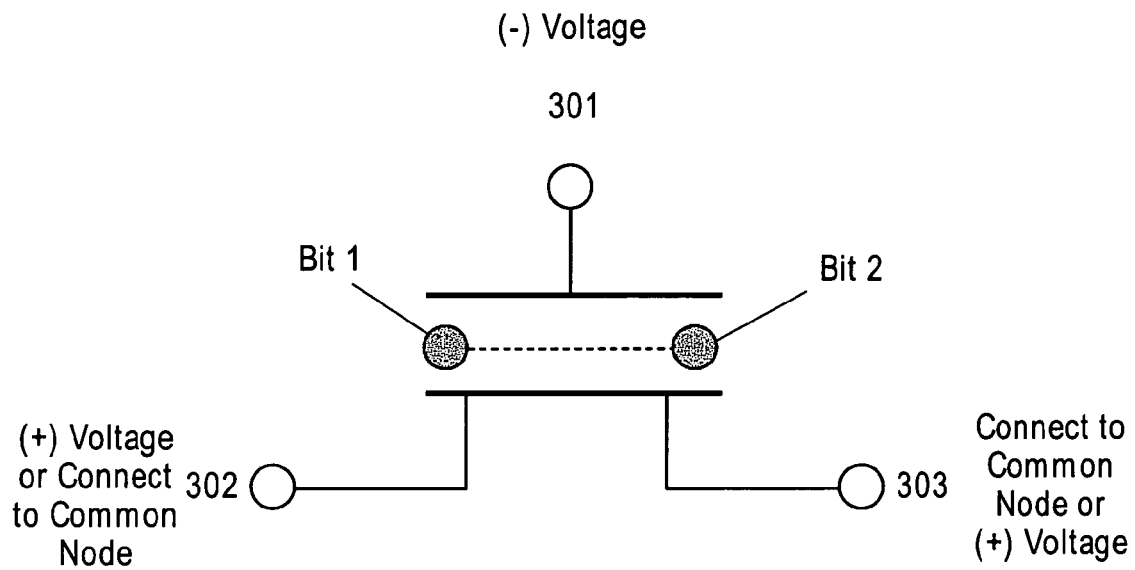
FIG. 3 illustrates one example of an NROM memory cell with exemplary node voltages capable of coupling to a common node.

FIG. 3 illustrates one example of an NROM memory cell having nodes capable of coupling to a common node for an erase operation. For example, to erase Bit 1, node 301 receives a (−) negative voltage from a negative pump circuit, node 302 receives a (+) positive voltage from a positive pump circuit, and node 303 is coupled to a common node. To erase Bit 2, node 301 receives a (−) negative voltage from a negative pump circuit, node 302 is coupled to a common node, and node 303 receives a (+) positive voltage from a positive pump circuit. The following TABLE 3 lists the voltages and connections for nodes 302 and 303 for erasing Bits 1 and 2 in FIG. 3, as detailed above.

TABLE 3

(Erase Operation Using Common Node)

| Nodes | Erasing Node 302 | Erasing node 303 |
| --- | --- | --- |
| Node 301 | (−) Negative Voltage | (−) Negative Voltage |
| Node 302 | (+) Positive Voltage | Couple to Common Node |
| Node 303 | Couple to Common Node | (+) Positive Voltage |

Referring to TABLE 3, in this example, when erasing Bits 1 and 2, the voltage level, provided by a common node connection, may be maintained at an proper value, such as a value that remains high enough to prevent punch through of the memory cell, but still remains low enough to maintain a strong lateral electric field in the channel region to render bit erase. In this manner, coupling nodes 302 and 303 to such common node may improve the erase uniformity of the memory cell.

Figure 4:
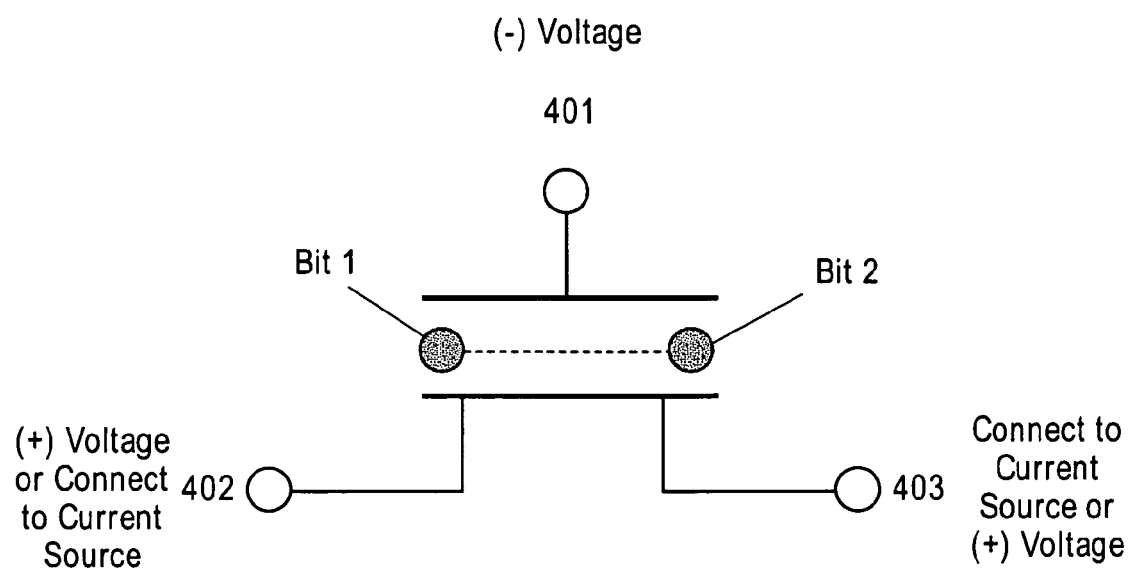
FIG. 4 illustrates one example of an NROM memory cell with exemplary node voltages capable of coupling to a limited current source.

FIG. 4 illustrates one example of an NROM memory cell having nodes capable of coupling to a limited current source for an erase operation. For example, to erase Bit 1, node 401 receives a (−) negative voltage from a negative pump circuit, node 402 receives a (+) positive voltage from a positive pump circuit, and node 403 receives current from a limited current source. To erase Bit 2, node 401 receives a (−) negative voltage from a negative pump circuit, node 402 receives current from a limited current source, and node 403 receives a (+) positive voltage from a positive pump circuit. The following TABLE 4 lists the voltages and connections for nodes 402 and 403 for erasing Bits 1 and 2 in FIG. 4, as detailed above.

TABLE 4

(Erase Operation Using Current Source)

| Nodes | Erasing Node 402 | Erasing node 403 |
| --- | --- | --- |
| Node 401 | (−) Negative Voltage | (−) Negative Voltage |
| Node 402 | (+) Positive Voltage | Couple to Current Source |
| Node 403 | Couple to Current Source | (+) Positive Voltage |

Referring to TABLE 4, in this example, when erasing Bits 1 and 2, the current level of the limited current source can be set at a ratio of the erase current consumption. For example, the current level can be based on a ratio of the band-to-band erase current level and the positive pump circuit loading current level. In this manner, the voltage level of nodes 402 and 403 can be dynamic and related to the other node's voltage level. For example, if bit-line stepping is applied for an embedded erase operation for node 402, then the voltage level of node 403 can be adjusted by the limited current source. Bit-line stepping erasing is the process that, if an erase verify fails after a one shot erase, the drain-side bit-line voltage level is increased for a retry erase shot. Also, because nodes 402 or nodes 403 of two or more memory cells in an array are commonly coupled to the same limited current source, the design may improve the erase uniformity of the memory cells in the array.

Figure 5:
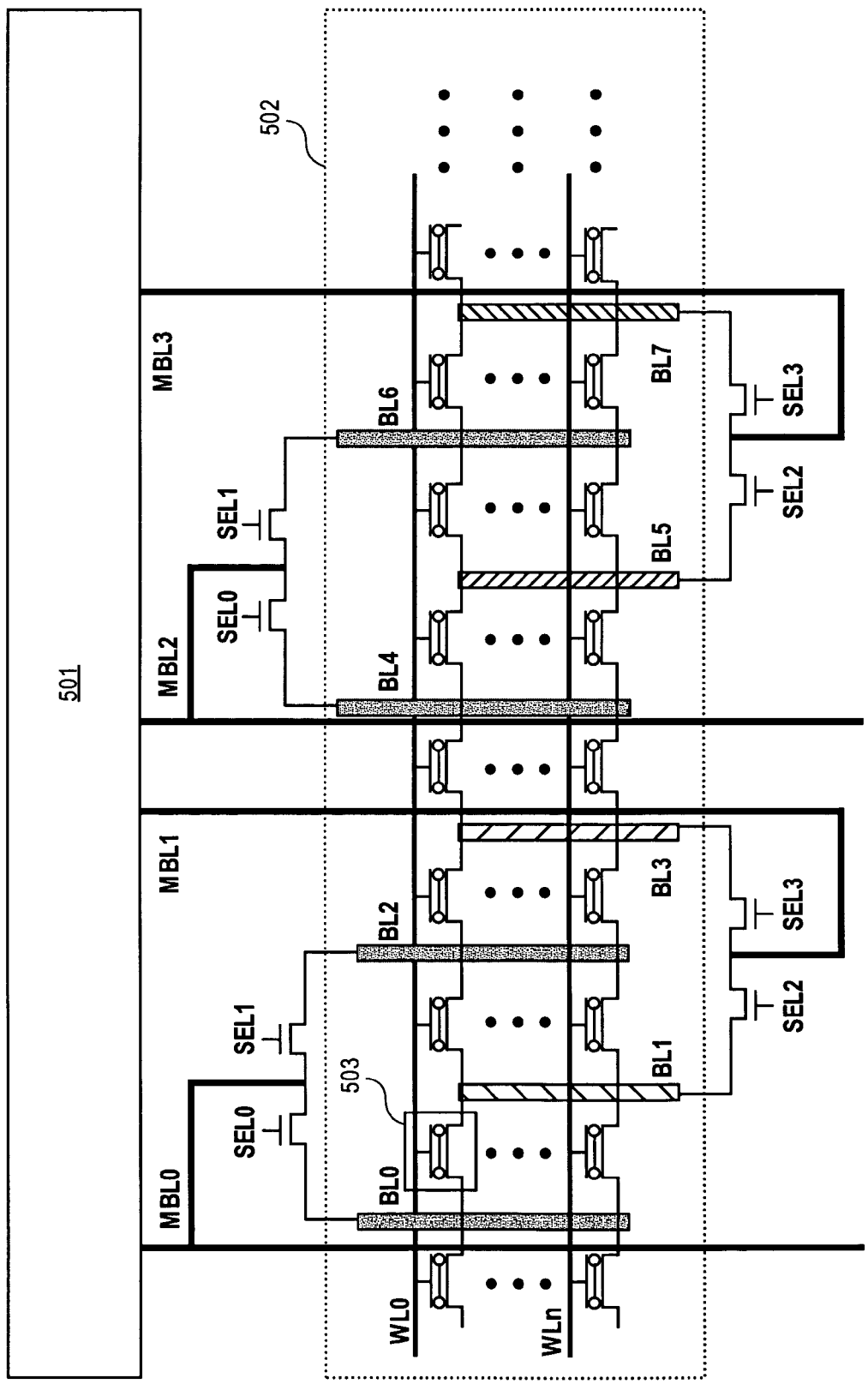
FIG. 5 illustrates one example of an NROM memory array having a virtual ground array and a discharge system.

FIG. 5 illustrates one example of an NROM memory array 500 capable of having the memory cells shown in FIGS. 3 and 4. For example, a plurality of memory cells 503 in the memory array 500 can refer to the memory cells described above. These memory cells 503 are arranged in "n" rows that can store two bits of information above a source junction and a drain junction per memory cell. In this example, the gate node of the first row of memory cells couples with a word line WL0 and the gate node of the $n^{th}$ row of memory cells couples with the $n^{th}$ word line WLn. Any number of memory cells and rows of memory cells can be implemented for memory array 500.

The memory array 500 also includes a virtual ground array 502 and a discharge system 501. In this example, the virtual ground array 502 outputs a plurality of metal bit lines, e.g., lines MBL0 to MBL3, that couple at nodes between select transistors having select inputs (SEL0, SEL1) and (SEL2, SEL3) arranged in series, respectively, for selectively providing voltage and/or current. The select transistors for controlling the coupling to MBLs have their gate nodes coupled to respective select inputs (e.g., SEL0, SEL1, SEL2, and SEL3) that selectively turn on their respective transistors. In this example, the select transistors are coupled to respective bit lines BL0 through BL7. Depending on which select transistors are on, the bit lines can be coupled to a common node or a limited current source via the metal bit lines ("MBLs") within the discharge system 501, as illustrated in FIG. 6 and explained in further detail below.

For example, if the select input SEL0 is on, the bit line BL0 couples with metal bit line MBL0 that can be coupled to a common node or limited current source within discharge system 501. Likewise, if the select input SEL1 is on, the bit line BL2 couples with metal bit line MBL0 that can be coupled to a common node or limited current source. In this manner, bit lines BL0 and BL2 can both be coupled to a common node or limited current source. The other bit lines can also be coupled to a common node or limited current source within discharge system 501 via metal bit lines MBL1 through MBL3 in a similar manner as bit lines BL0 and BL2.

Thus, the select inputs allow control of coupling certain nodes of the memory cells to a common node or a limited current source. In particular, the even-numbered bit-line connections, e.g., BL0, BL2, BL4, and BL6, couple with the nodes of the transistors coupled to select inputs SEL0 and SEL1. The odd-numbered bit-line connections, e.g., BL1, BL3, BL5, and BL7, couple with the nodes of the transistors coupled to select inputs SEL2 and SEL3. In this manner, sets of bit-line connections pair other sets of bit-line connections. For example, even bit-line connections BL0 and BL2 pair with odd bit-line connections BL1 and BL3 to at least control erasing of four memory cells in four columns.

Figure 6:
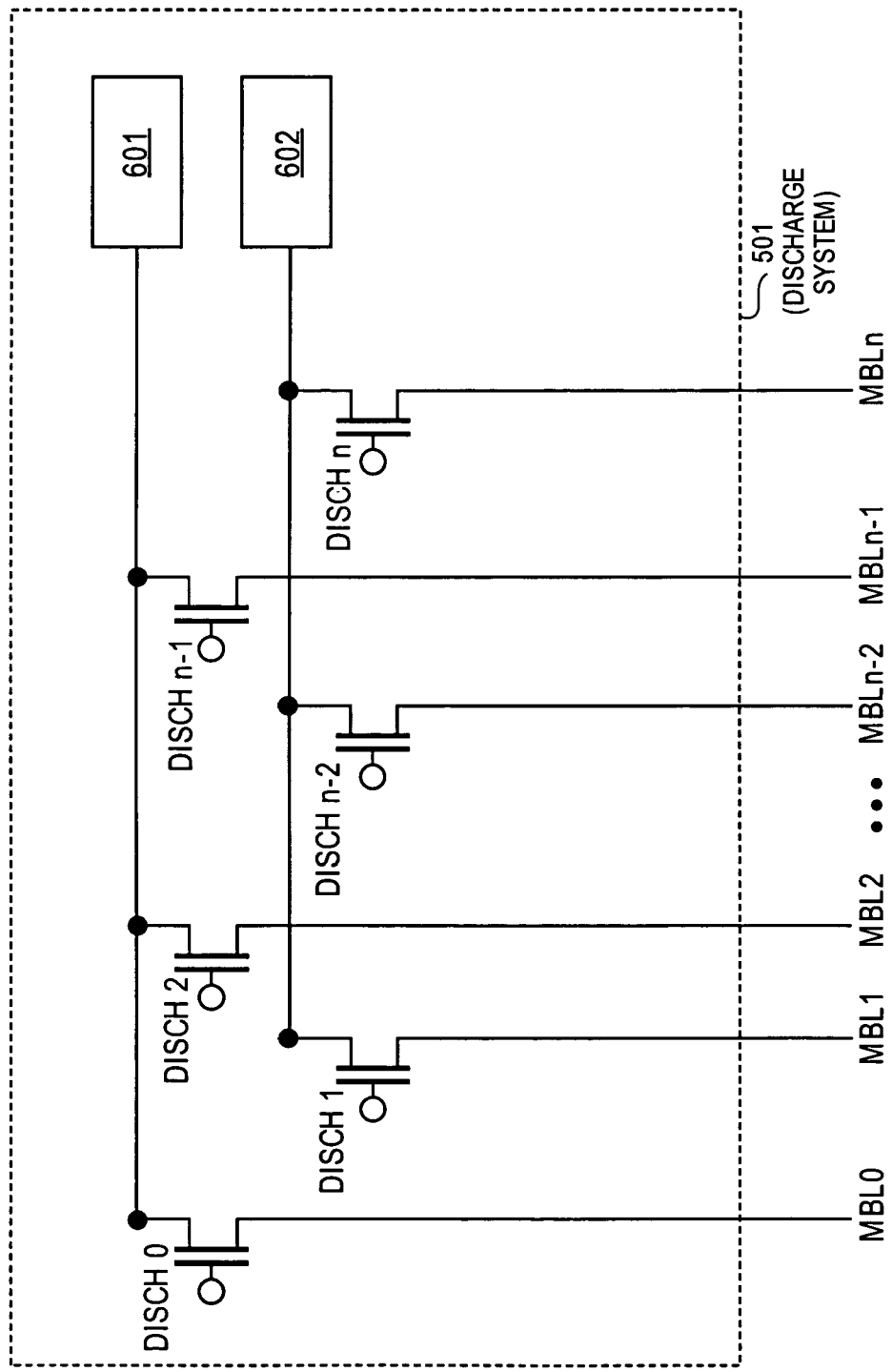
FIG. 6 illustrates one example of the discharge system of FIG. 5 in further detail.

FIG. 6 illustrates the discharge system 501 of FIG. 5 in further detail. The discharge system includes nodes 601 and 602 and a plurality of discharge or pull-down transistors DISCH 0 through DISCH n coupled to respective metal bit lines MBL0 through MBLn. The nodes 601 and 602 can represent a common node or a current source or connect to the same. In this example, node 601 is coupled to discharge transistors DISCH 0, DISCH 2, and DISCH n−1 and node 602 is coupled to discharge transistors DISCH 1, DISCH n−2, and DISCH n. When the discharge transistors are on, the discharge system 501 can connect the metal bit lines MBLs to a common node or act as limited current source.

In one example, nodes 601 and 602 can be or connect to a common node, examples of which include a floating ground or a positive voltage source. If the common node is a positive voltage source, the voltage level from this source should be set high enough to prevent punch-through and low enough to maintain a lateral electric field for proper erase capabilities. If nodes 601 and 602 are common nodes and a particular discharge transistor is on, the corresponding metal line to the discharge transistor will be coupled to a common node. If the discharge system 501 acts as a limited current source, the nodes 601 or 602 can be or connect to a current source. When a discharge transistor is on, it will discharge a current from its corresponding node 601 or 602 that is or connect to a current source, thereby providing a limited current source.

The operation of erasing a memory cell with respect to FIGS. 5 and 6 will now be described. Referring to FIG. 5, if the side supplying a (+) positive voltage to 503 memory cell during an erase operation, the side will turn off a corresponding discharge transistor and the opposite side of the memory cell will couple to a common node or to a limited current source within the discharge system 501 shown in FIG. 6.

For example, in FIG. 5, to erase even bits (adjacent to the even bit lines BL0, BL2, BL4, BL6, and so on) of the NROM memory cells 503, the even metal bit lines (MBL0, MBL2, and so on) can be coupled to positive voltage sources using Y-pass gates and Y-decoders (or column decoders) for erasing the drain-side bias. The odd metal bit lines (MBL1, MBL3, and so on) can be coupled to node 602 that is or connected to a common node or current source within discharge system 501 via respective discharge transistors. To erase odd bits (adjacent to odd bit lines BL1, BL3, BL5, BL7, and so on) of the NROM memory cells, the odd metal bit lines (MBL1, MBL3, and so on) can be coupled to positive voltage sources using Y-pass gates and Y-decoders (or column decoders) for erasing drain-side bias. The even metal bit lines (MBL0, MBL2, and so on) can be coupled to node 601 that is or connected to a common node or a current source via respective discharge transistors.

The following TABLE 5 illustrates exemplary voltage values for erasing bits in the memory array 500 of FIG. 5 in a user mode and test mode.

TABLE 5

|  | User mode | | Test mode | |
| --- | --- | --- | --- | --- |
|  | Even Bits | Odd Bits | Even Bits | Odd Bits |
| WL | VG (−3 V) | VG (−3 V) | VG (−3 V) | VG (−3 V) |
| MBL even | VD (4~8 V) | VS (501) | VD (4~8 V) | VS (501) |
| MBL odd | VS (501) | VD (4~8 V) | VS (501) | VD (4~8 V) |
| SEL 0/1 | 11 V | 11 V | 11 V | GND |
| SEL 2/3 | 11 V | 11 V | GND | 11 V |
| BL even | VD (4~8 V) | VS (501) | VD (4~8 V) | Floating |
| BL odd | VS (501) | VD (4~8 V) | Floating | VD (4~8 V) |

Referring to Table 5, during user mode erase operation, the memory cells 503 at the drain node are coupled to a positive pump circuit and the memory cells 503 at the source node are coupled to a common node or a limited current source by the discharge system 501 (e.g., the select inputs SEL0 to SEL3 all turn-on). By coupling the source node of two or more memory cells together to a common node, the source-side voltage of every NROM cell in memory array which be erased are balanced and identical among themselves, thereby providing a proper level that may be high enough to prevent punch through and low enough to maintain the lateral electric field for erase operations.

In this manner, the erase uniformity across the memory cells of the memory array 500 is improved. During test mode for an erase operation, the memory cells at the source node are separated and kept floating by having half of the select inputs SEL0 to SEL3 on and the other half off. Therefore, during test mode erase operation the source-side (BLn) voltage of every column of NROM memory cell may be different due to bit-line coupling or leakage current caused by marginal defects, such as buried drain oxide breakdown, source-drain leakage, and so forth. The source-side voltage different of memory cell will caused the erase ability and speed non-uniform. This allows for easy screening of hard defects of the memory cells performing unsatisfactory erase operations.

Figure 7:
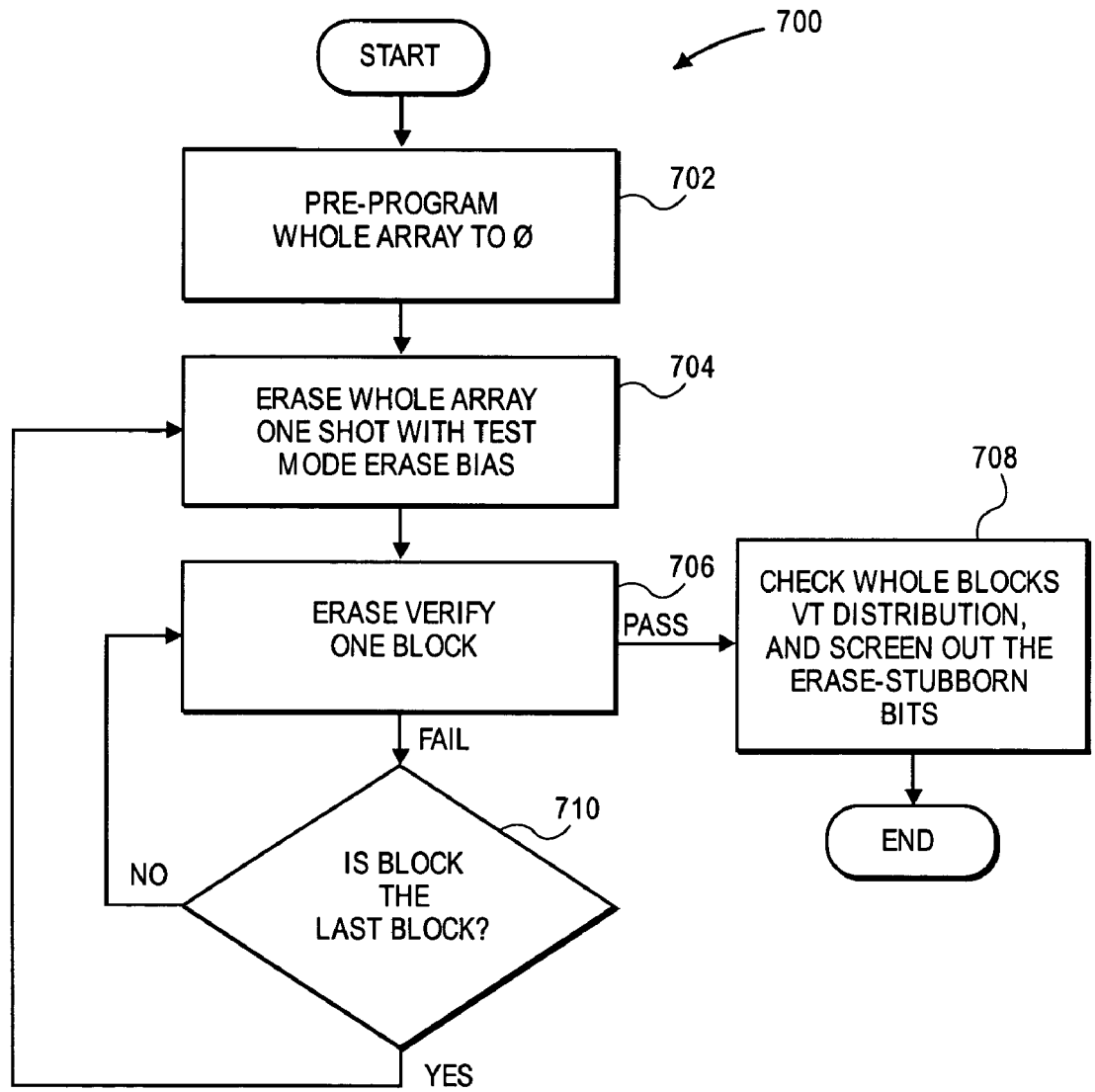
FIG. 7 illustrates one example of a flow diagram to screen for marginal memory cells performing defective erase operations.

FIG. 7 illustrates one example of a flow diagram 700 to screen for marginal memory cells performing defective erase operations. Initially, the whole memory array is pre-programmed to "0" (step 702). Next, the whole memory array is erased with test mode erase bias (step 704). After the erase operation, each memory block is verified (step 706). If any block verification fails, a determination is made if it was the last block. If yes, operation 700 returns to step 704. If not, operation 700 returns to step 706.

At step 706, if any block verification passes, the whole memory blocks the threshold voltage (VT) distribution is checked and the erase-stubborn bits are screened out (step 708). Through the screening process, a defective or marginal cell, which may include a cell that is not aligned with other cells in operational characteristics, may be identified. A defective or marginal cell may be replaced with a dummy cell or back-up cells that is available to a memory array, such as by rewiring the dummy or back-up cell to become part of the array. Therefore, the operational integrity or uniformity of the array may be achieved.

Figure 8:
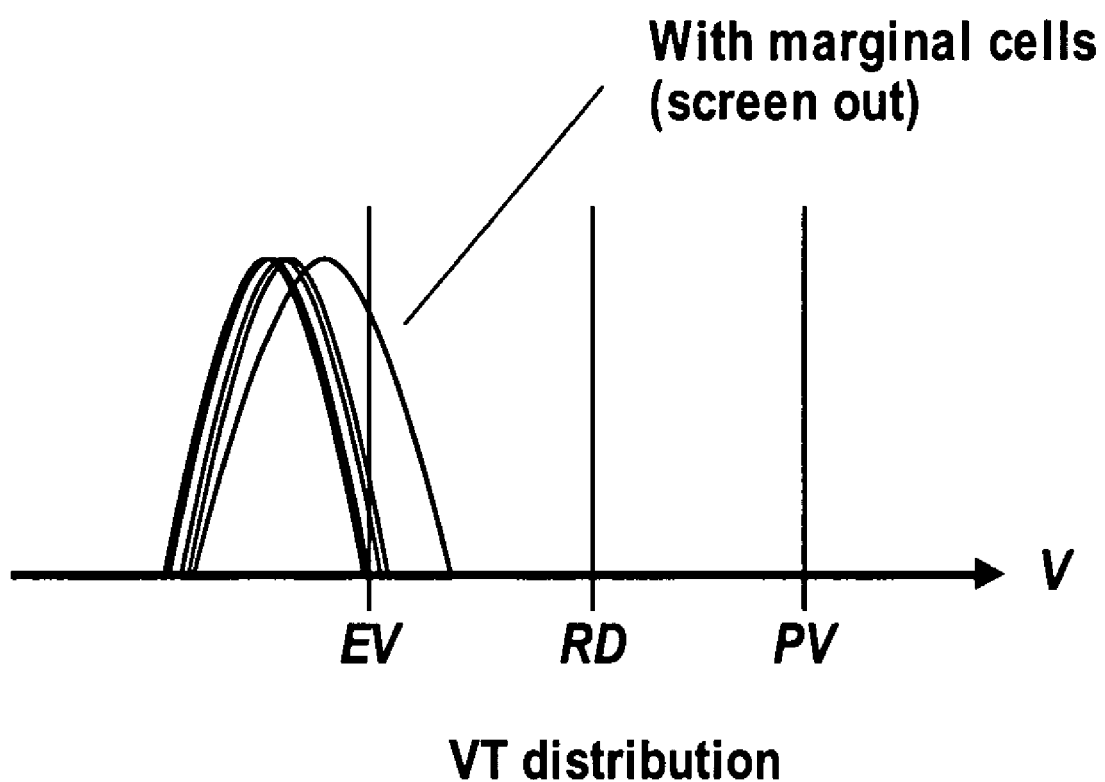
FIG. 8 illustrates one example voltage distribution for screening out marginal memory cells.

Referring to FIG. 8, an exemplary threshold voltage (VT) distribution is shown where the Vt distribution for marginal cells deviates from the non-marginal cells. EV stands for erase verify WL voltage, RD stands for read WL voltage, and PV stands for programming verify WL voltage.

Figure 9:
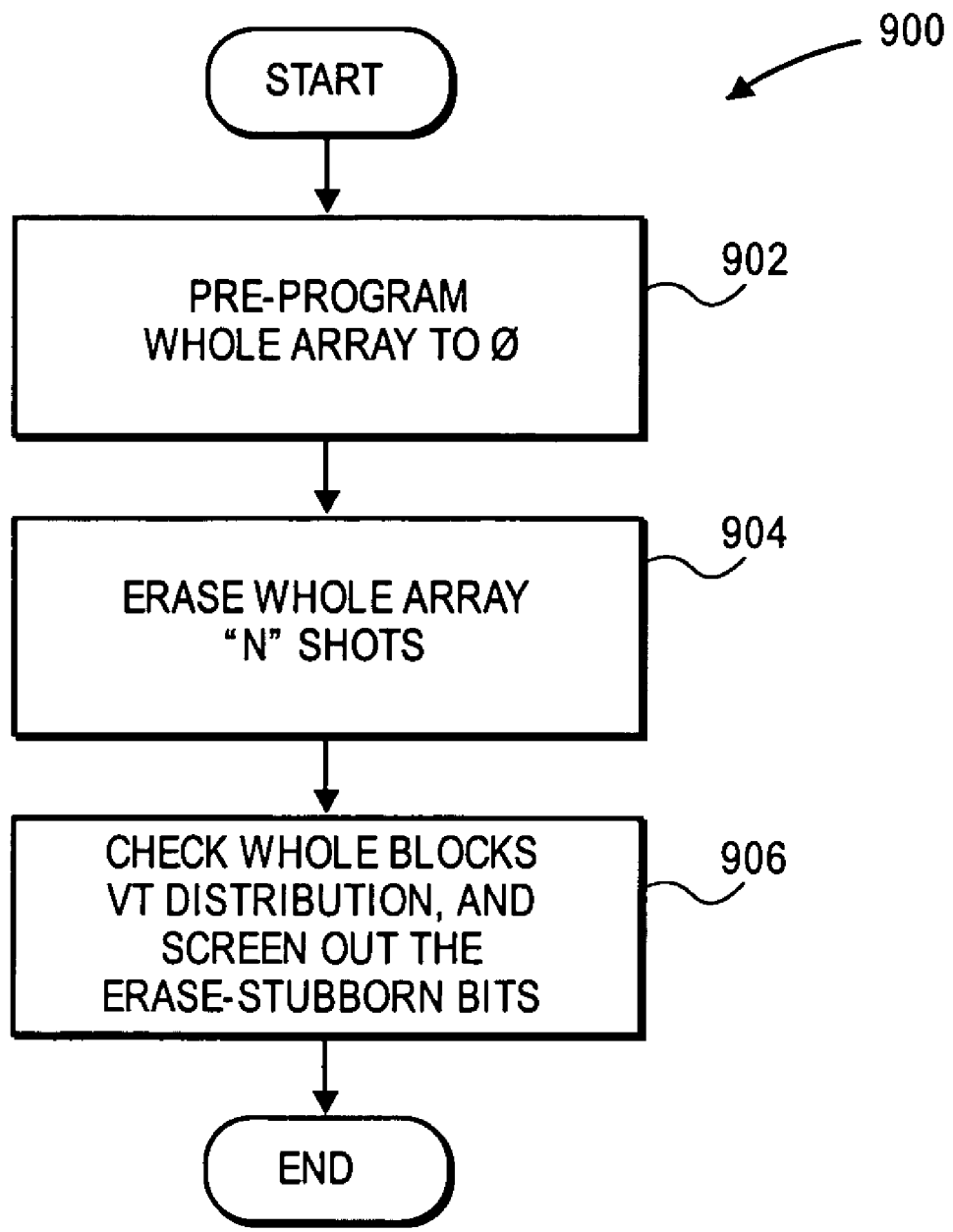
FIG. 9 illustrates another example of a flow diagram to screen for marginal memory cells performing defective erase operations.

FIG. 9 illustrates another example flow diagram 900 to screen for marginal memory cells performing defective erase operations. Initially, the whole memory array is pre-programmed to "0" (step 902). Next, the whole array is erased using "N" shots, e.g. by injecting holes. The memory blocks are checked by the VT distribution, as shown in FIG. 8, and the erase-stubborn bits are screened out from the non-erase-stubborn bits.

Thus, NROM memory devices and methods to improve erase uniformity and to screen for marginal memory cells have been described. In the foregoing specification, the invention has been described with reference to specific examples and embodiments. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for determining marginal memory cells in a memory array having a plurality of memory cell blocks, the method comprising:

pre-programming bits of the memory cells in the memory array to a pre-defined value;

erasing with a first erase shot the memory cells in the memory array;

verifying the erased memory cells of the memory array by blocks;

stopping the verifying when any one memory block of memory array passes the verifying; and after stopping erase verification, screening out marginal memory cells in the memory array based on a threshold voltage distribution of the memory cells, wherein the screening out marginal memory cells includes identifying erase-stubborn bits based on the threshold voltage distribution of the memory cells.

2. The method of claim 1, wherein the voltage distribution of erase-stubborn bits deviates from the voltage distribution of non-erase-stubborn bits.

3. The method of claim 2, wherein the erase-stubborn bits are identified as marginal memory cells for performing an erase operation.

4. The method of claim 1, wherein the pre-programming includes pre-programming the memory cell bits of the memory array to 0.

5. The method of claim 1, wherein the erasing includes erasing the memory array with a one shot test mode erase bias operation.

6. The method of claim 1, further comprising:

replacing the memory cells screened as marginal with dummy memory cells or back-up memory cells.

7. The method of claim 1, further comprising:

erasing with a second erase shot the memory cells in the memory array only if all the blocks fail the verifying step.

* * * * *